United States Patent
Afzali-Ardakani et al.

(10) Patent No.: US 8,354,333 B2
(45) Date of Patent: Jan. 15, 2013

(54) PATTERNED DOPING OF SEMICONDUCTOR SUBSTRATES USING PHOTOSENSITIVE MONOLAYERS

(75) Inventors: Ali Afzali-Ardakani, Yorktown Heights, NY (US); Devendra K. Sadana, Yorktown Heights, NY (US); Lidija Sekaric, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 368 days.

(21) Appl. No.: 12/699,552

(22) Filed: Feb. 3, 2010

(65) Prior Publication Data

US 2011/0186969 A1    Aug. 4, 2011

(51) Int. Cl.
  *H01L 21/22* (2006.01)
  *H01L 21/38* (2006.01)
(52) U.S. Cl. ............ 438/542; 438/549; 438/556; 257/9; 257/632; 257/347; 257/E29.005; 257/E21.135
(58) Field of Classification Search .............. 257/9, 632, 257/347, E29.005, E21.135; 438/542, 549, 438/556

See application file for complete search history.

(56) References Cited

U.S. PATENT DOCUMENTS

| | | |
|---|---|---|
| 5,378,502 A | 1/1995 | Willard et al. |
| 6,559,070 B1 * | 5/2003 | Mandal .......................... 438/781 |
| 2009/0098347 A1 | 4/2009 | Afzali-Ardakani et al. |
| 2009/0226615 A1 | 9/2009 | Nakazawa |
| 2009/0227059 A1 | 9/2009 | Besnard et al. |

FOREIGN PATENT DOCUMENTS

| | | |
|---|---|---|
| EP | 1 610 176 A2 | 12/2005 |
| WO | WO 2008028365 A1 | 3/2008 |
| WO | WO 2008055054 A2 | 5/2008 |

OTHER PUBLICATIONS

Arai, et al., "Self-Aligned Fabrication Process of Electrode for Organic Thin-Film Transistors on Flexible Substrate Using Photosensitive Self-Assembled Monolayers", Japanese Journal of Applied Physics, vol. 46, No. 4B, 2007, pp. 2700-2703.

Lygeraki, et al., "Controlling the reversible wetting capability of smart photochromic-polymer surfaces by micro patterning", Appl. Phys. A 91, pp. 397-401 (2008) DOI: 10.10071s00339-008-4473-7, Accepted: Feb. 25, 2008 Published online: Mar. 29, 2008, Springer-Verlag 2008.

(Continued)

Primary Examiner — Tu-Tu Ho
(74) Attorney, Agent, or Firm — Scully, Scott, Murphy & Presser, P.C.; Vazken Alexanian

(57) ABSTRACT

A semiconductor device and a method of fabricating a semiconductor device are disclosed. Embodiments of the invention use a photosensitive self-assembled monolayer to pattern the surface of a substrate into hydrophilic and hydrophobic regions, and an aqueous (or alcohol) solution of a dopant compound is deposited on the substrate surface. The dopant compound only adheres on the hydrophilic regions. After deposition, the substrate is coated with a very thin layer of oxide to cap the compounds, and the substrate is annealed at high temperatures to diffuse the dopant atoms into the silicon and to activate the dopant. In one embodiment, the method comprises providing a semiconductor substrate including an oxide surface, patterning said surface into hydrophobic and hydrophilic regions, depositing a compound including a dopant on the substrate, wherein the dopant adheres to the hydrophilic region, and diffusing the dopant into the oxide surface of the substrate.

15 Claims, 4 Drawing Sheets

OTHER PUBLICATIONS

Tadanaga, et al., "Micropatterning of SnO2 thin films using hydrophobic-hydrophilic patterned surface", Dept. of Applied Materials Science, Graduate School of Engineering, Osaka Prefecture University, Sakai, Osaka 599-8531, Japan; Dept. of Materials Science, Toyohashi University of Technology, Toyohashi, Aichi 441-8580, Japan, Jul. 3, 2004.

Ho, et al., "Controlled nanoscale doping of semiconductors via molecular monolayers", nature materials, vol. 7, Jan. 2008, pp. 62-67.

Popadic, et al., "Ultra-Shallow Dopant Diffusion From Pre-Deposited RPCVD Monolayers of Arsenic and Phosphorus", 15th IEEE International Conference on Advanced Thermal Processing of Semiconductors—RTP2007, 2007 IEEE.

Chenthamarakshan, et al., "Leveraging social networks for corporate staffing and expert recommendation", IBM J. Res. & Dev., vol. 56, No. 3, Paper 11 2009, pp. 11:1-11:11.

* cited by examiner

PATTERNED DOPING OF SEMICONDUCTOR SUBSTRATES USING PHOTOSENSITIVE MONOLAYERS

BACKGROUND OF THE INVENTION

1. Field of the Invention

This invention generally relates to semiconductors, and more specifically, to patterned doping of semiconductor substrates using photosensitive monolayers. Embodiments of the invention, even more specifically, relate to such patterned doping of extremely thin semiconductor layers.

2. Background Art

In order to be able to make integrated circuits (ICs), such as memory, logic, photovoltaic, and other devices, of higher integration density than currently feasible, one has to find ways to further downscale the dimensions of semiconductors, such as complementary metal oxide semiconductors (CMOS) and photovoltaic devices. Scaling achieves compactness and improves operating performance in devices by shrinking the overall dimensions and operating voltages of the device while maintaining the device's electrical properties. Additionally, all dimensions of the device must be scaled simultaneously in order to optimize the electrical performance of the device.

With conventional semiconductor scaling reaching fundamental limits, the semiconductor industry is looking at more unconventional and new approaches that will facilitate continued device performance improvements. As a result, attention has been given to using semiconductors with ultra or extremely thin silicon layers where the silicon or "device" layer has a thickness of from about seven nm and about ten nm.

Ultra thin semiconductor devices have very substantial advantages, however they also present difficult challenges. For instance, these devices can experience threshold-voltage and subthreshold slope fluctuation because of silicon thickness variations across the wafer. For example, a common silicon-on-insulator (SOI) device may have a silicon layer thickness of from 4-8 nm, with a variation in this thickness of 1 or more nm across the wafer.

Also, it has been determined that when conventional procedures are used to implant dopants into semiconductor layers that have a thickness of 10 nm or less, the ion implantation amorphizes the semiconductor layer. Recrystallizing the amorphous semiconductor layer is difficult, because of the limited amount of crystal seed layer that is available in semiconductor layers having a thickness of less than 10 nm that have been ion implanted into an amorphous crystal structure. The presence of an amorphous semiconductor material in a semiconductor device results in the semiconductor device having a high external resistance. Further, the resistance of the semiconductor device is increased by defects in the semiconductor layer that are produced by ion implantation. The ion implantation may also damage the gate dielectric.

As a result, conventional ion implantation procedures appear to be unsuitable for doping ultra thin semiconductor devices.

BRIEF SUMMARY

Embodiments of the invention provide a semiconductor device and a method of fabricating a semiconductor device. Embodiments of the invention use a photosensitive self-assembled monolayer to pattern the surface of a substrate into hydrophilic and hydrophobic regions, and an aqueous (or alcohol) solution of the dopant compound (e.g., boric acid, organic boronic acid, phosphonic acids, etc) is deposited by spin coating or doctor blading upon which these materials will only deposit on the hydrophilic regions. After deposition, the substrate is then coated with a very thin layer of oxide (e.g. aluminum oxide or hafnium oxide) by atomic layer deposition to cap the compounds and the substrate is annealed at high temperatures to diffuse the dopant atoms into the silicon and to activate the dopant.

In one embodiment, the method comprises providing a semiconductor substrate including an oxide surface, patterning said surface into hydrophobic and hydrophilic regions, depositing a compound including a dopant on the substrate, wherein the dopant adheres to the hydrophilic region, and diffusing the dopant into the oxide surface of the substrate.

The dopant compound may, for example, be an aqueous or alcohol solution. In one embodiment, the method further comprises capping the dopant compound on the substrate. This capping, for example, may include forming an oxide layer over the oxide surface of the substrate. In an embodiment, the diffusing includes annealing the substrate to diffuse the dopant into the oxide surface of the substrate; and in an embodiment, this annealing is done after the capping the dopant compound.

In one embodiment, the patterning includes applying a monolayer of a photosensitive material to said oxide surface; and exposing the monolayer to radiation to form the monolayer into a pattern of hydrophobic and hydrophilic regions. The dopant compound adheres to the hydrophilic regions, and does not adhere to hydrophobic regions of the monolayer.

DETAILED DESCRIPTION

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, and some features may be exaggerated to show details of particular components. Therefore, specific structural and functional details disclosed herein are not to be interpreted as limiting, but merely as a representative basis for teaching one skilled in the art to variously employ the present invention.

In one embodiment, the present invention relates to a semiconductor device and to a method of fabricating a semiconductor device. Generally, in one embodiment, the invention uses a photosensitive self-assembled monolayer to pattern the surface of a semiconductor substrate into hydrophilic and hydrophobic regions, and an aqueous (or alcohol) solution of a dopant compound (e.g. boric acid, organic boronic acid, phosphonic acids, etc.) is deposited on the semiconductor surface by, for example, spin coating or doctor blading. These deposited materials will only attach on the hydrophilic regions. After deposition, the substrate is then coated with a very thin layer of oxide (e.g. aluminum oxide or hafnium oxide) by atomic layer deposition, vacuum evaporation or alternatively by solution deposition of spin-on glass or spin-on hanium oxide followed by annealing to cap the compounds, and then the substrate is annealed at high temperatures to diffuse the dopant atoms into the silicon and to activate the dopant.

Figure 1:
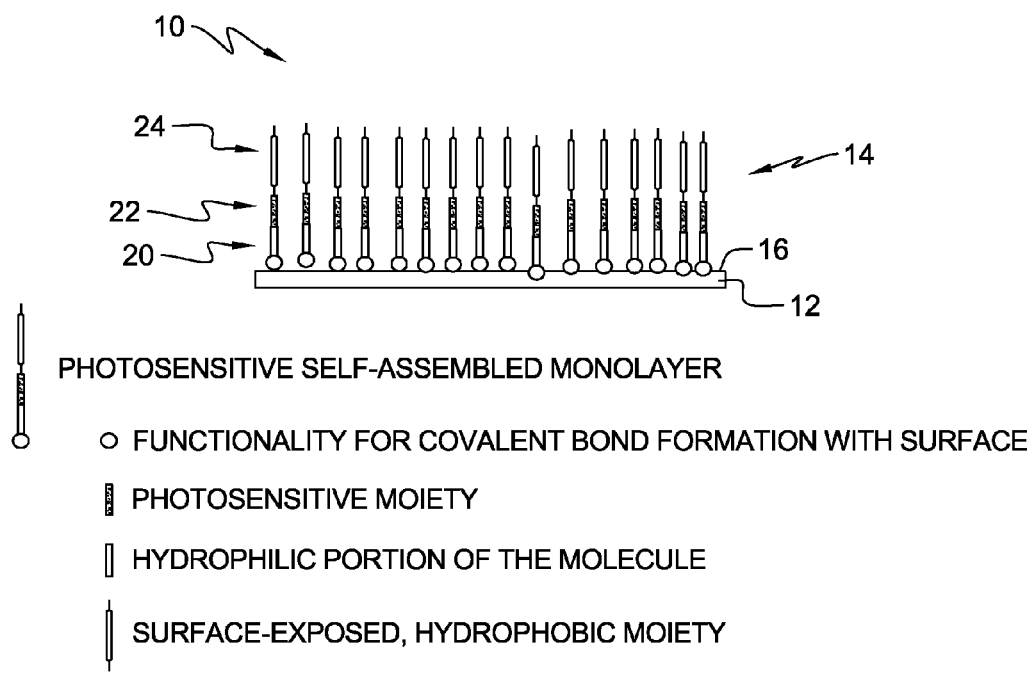
FIG. 1 shows a semiconductor structure having a monolayer of a photosensitive material.

FIG. 1 illustrates an exemplary structure 10 comprising a substrate 12 and a monolayer of a photosensitive material 14. The substrate 12 may comprise an insulator material, a semiconductor material, or a metallic material. For example, substrate 12 may be Si, although other suitable semiconductor materials may be used. For example, SiC, SiGe, SiGeC, Si alloys, Ge, Ge alloys, GaAs, InAs, and InP, as well as other III/V and II/VI compound semiconductors, may be used.

The top surface 16 of the substrates contacts the monolayer of the photosensitive material 14, and this surface 16 comprises an oxide surface, which may contain a metal oxide or a semiconductor oxide. The metal oxide includes at least one elemental metal. The semiconductor oxide, in one embodiment, is a compound of a semiconductor material and oxygen, and this semiconductor material may be, for example, silicon, germanium, carbon, or an alloy thereof.

Figure 2:
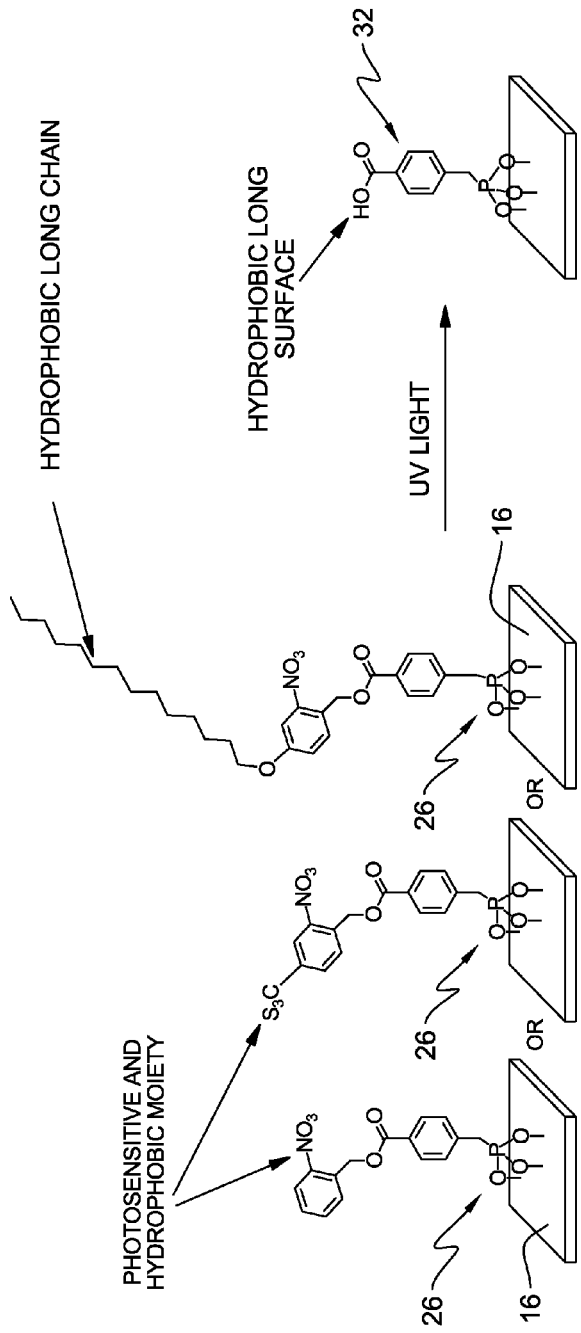
FIG. 2 depicts the attachments of different types of photosensitive material to the semiconductor structure.

The monolayer of the photosensitive material 14 is attached to the oxide surface 16 by covalent bonds. The photosensitive material comprises three groups: a first end group 20, a photosensitive group 22, and a second end group 24. The first end group 20 forms the covalent bonds with the oxide surface 16, which, as mentioned above, comprises either an oxide surface or a semiconductor material and oxygen. With reference to FIGS. 1 and 2, the first end group 20 may, as examples, comprise a carboxylic acid, a phosphonic acid or, a hydroxamic acid.

The photosensitive group 22 is linked to the first end group 20, and the photosensitive group 22 dissociates upon exposure to ultraviolet radiation. Also with reference to FIGS. 1 and 2, the photosensitive group 22 may comprise a nitribenzyl moiety having a photosensitive bond such as a CO—O—CH$_2$ bond or a CH$_2$—NH—CO bond.

The second end group 24 is linked to the photosensitive group 22 and provides hydrophobicity to the photosensitive material. The second end group 24 may comprise one of hydrogen, fully or partially fluorinated alkyl, fully or partially fluorinated alkoxy, or fully or partially fluorinated alkylthio, and the total number of carbon atoms in this alkyl, alkoxy, or alkylthio may, in embodiments of the invention, be from 1 to 20.

The covalent bonds between the first end group 20 in each molecule of the photosensitive compound 14 and the oxide surface 16 enables self-assembly of the photosensitive material on the oxide surface 16 as a monolayer. This is because the covalent bond, represented at 26, is formed only between the acidic end group of the photosensitive material and the oxide surface, and more specifically, this bond is formed between a plurality of oxygen atoms of the end group of the photosensitive material, and that oxide surface 16. The molecules of the photosensitive material do not provide atoms available for covalent bonding except for those that are bonded to the oxide surface.

Figure 3:
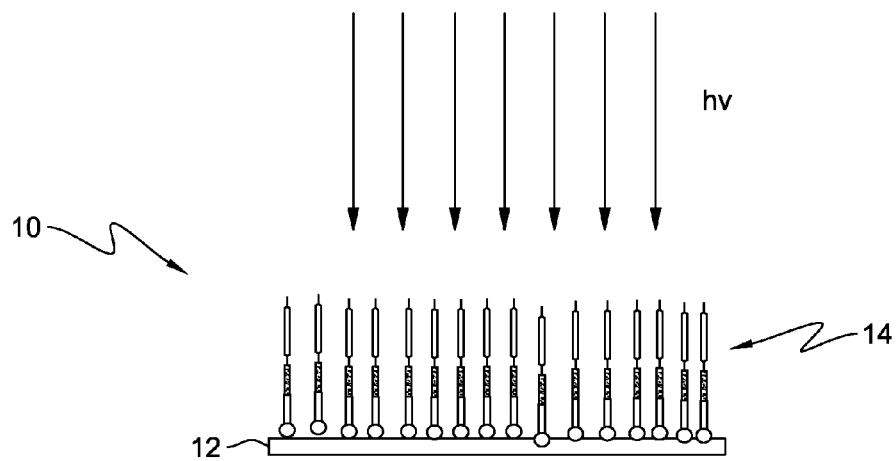
FIG. 3 illustrates a patterned beam of radiation applied to the structure of FIG. 1.

As illustrated in FIG. 3, the structure 10 is subjected to a patterned beam of ultraviolet radiation. A conventional lithography tool and a conventional lithographic mask may be employed to generate the patterned beam of ultraviolet radiation. Application of a photoresist onto the structure 10 is not necessary, though, since the monolayer 14 of the photosensitive material reacts with the patterned beam of ultraviolet radiation.

With reference again to FIGS. 2 and 3, the photons of the patterned beam of ultraviolet radiation react with the photosensitive group 22 to dissociate the photosensitive group 22 within the exposed region of the monolayer of the photosensitive material 14. As the photosensitive group 22 dissociates by the ultraviolet radiation, the second end group 24 having hydrophobicity is removed along with some atoms of the photosensitive group 22. The remaining portion 32 of the photosensitive group 22 forms a derivative of the photosensitive group having an exposed hydrophilic functionality. After removal of the cleaved portion containing the second end group 24, for example, in an aqueous or aqueous alcohol solution, the exposed portion of the monolayer 14 containing the exposed photosensitive material has a hydrophilic surface.

Figure 4:
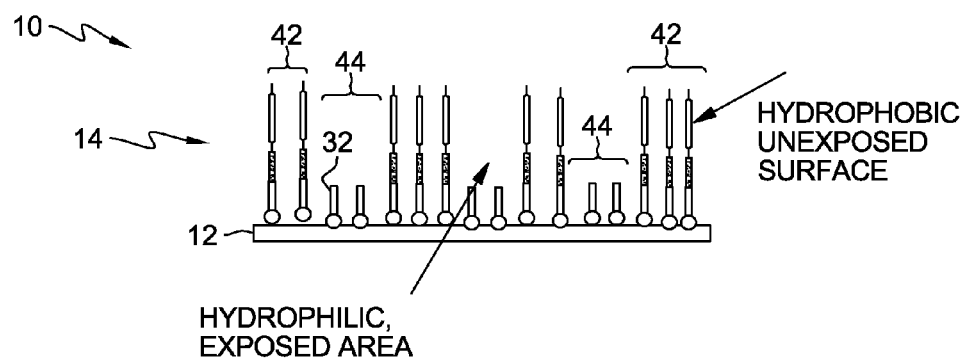
FIG. 4 shows the patterned monolayer formed by the applied radiation.

With reference to FIG. 4, the monolayer is thus patterned and includes at least one first region 42 and at least one second region 44. The first region 42 comprises the photosensitive material, and the second region 44 has a lithographic dimension and comprises the derivative of the photosensitive material. The derivative of the photosensitive material comprises the first end group 22 and has hydrophilicity The monolayer 14 may contain more than one first region 42 and/or more than one second region 44; and typically, the patterned monolayer 14 comprise a plurality of first regions 42 and a plurality of second regions 44. Since the monolayer 14 includes a single layer of material, the first region 42 and the second region 44 laterally abut, and do not overlie, each other.

A variety of photosensitive materials may be employed to form monolayer 14. For instance, suitable photosensitive materials are disclosed in copending application Ser. No. 11/871,167, for "Photosensitive Self-Assembled Monolayer For Selective Placement Of Hydrophilic Structures," the disclosure of which is herein incorporated by reference in its entirety.

As one example, a suitable photosensitive phosphonic acid may be synthesized in the following manner.

A mixture of methyl 4-bromomethylbenzoate and triethyl phosphate is formed and heated at an elevated temperature. For example, 10 grams of methyl 4-bromomethylbenzoate and 40 grams of triethyl phosphate may be mixed and heated at 120° C. for 4 hours. The solution is cooled and excess triethyl phosphite may be evaporated under reduced pressure to form a light yellow oil, which is methyl diethylphosphonatomathyl-benzoate. Methyl diethyl-phosphonatomathyl-benzoate in the form of the light yellow oil may be used without farther purification in the next step.

Methyl diethylphosphonatomathylbenzoate is then dissolved in methanol and lithium hydroxide is added to the solution. For example, 10 grams of methyl diethylphosphonatomathyl-benzoate may be dissolved in 50 ml of methanol and 40 ml of 5% lithium hydroxide may be added. The mixture is then stirred, for example, at room temperature for 5 hours. Methanol is then evaporated under reduced pressure and the aqueous solution is then made acidic by addition of dilute hydrochloric acid. The precipitate is filtered, washed with water, and then dried. Recrystallization from water produces white crystals of 4-diethylphosphonatomethyl benzoic acid.

4-diethylphosphonatomethyl benzoic acid is then added to anhydrous dichloromethane. For example, 5.0 grams of 4-diethylphosphonatomethyl benzoic acid may be added to 50 ml of anhydrous dichloromethane. Excess amount of oxalyl chloride is added to this solution. A trace amount of N,N-dimethylformamide is then added to the solution. The mixture may be stirred, for example, under nitrogen for 4 hours. The solvent and the excess oxalyl chloride is then evaporated under reduced pressure to produce a colorless oil, which is 4-diethylphosphonato-methyl benzoic acid.

4-diethylphosphonato-methyl benzoic acid thus obtained in the form of the colorless oil is then dissolved in anhydrous dichloromethane. The solution is then added to a solution of 2-nitrobenzyl alcohol in dichloromethane containing triethylamine. After stirring 4 hours at room temperature, the solution is washed with 5% sodium bicarbonate, dilute hydrochloric acid and brine successively, and then dried over anhydrous magnesium and filtered. The solvent is then evaporated under reduced pressure and solid residue is crystallized from ethanol to give a phosphonate ester. The ester is dissolved in anhydrous dichloromethane and treated with 4 equivalent of bromotrimethylsilane, and then stirred under nitrogen for 5 hours. Methanol and a few drops of hydrochloric acid are added and stirring may be continued for an additional 1 hour. The precipitate is filtered and washed with ether, dried and crystallized from ethanol to form photosensitive phosphonic acid as white crystals.

The above procedure may be performed with the replacement of the 2-nitrobenzyl alcohol with 4-trifluoromethyl-2-nitrobenzyl alcohol. A 4-substituted photosensitive phosphonic acid is obtained by this process. Purification of this compound may be performed through crystallization from ethanol.

Further, the above procedure may be performed with the replacement of the 2-nitrobenzyl alcohol with 4-hexadecyloxy-2-nitrobenzyl alcohol. Another 4-substituted photosensitive phosphonic acid is obtained by this process. Purification of this compound may be performed through crystallization from toluene-ethanol mixture.

In general, various alcohols may be employed to produce various photosensitive phosphonic acids.

Figure 5:
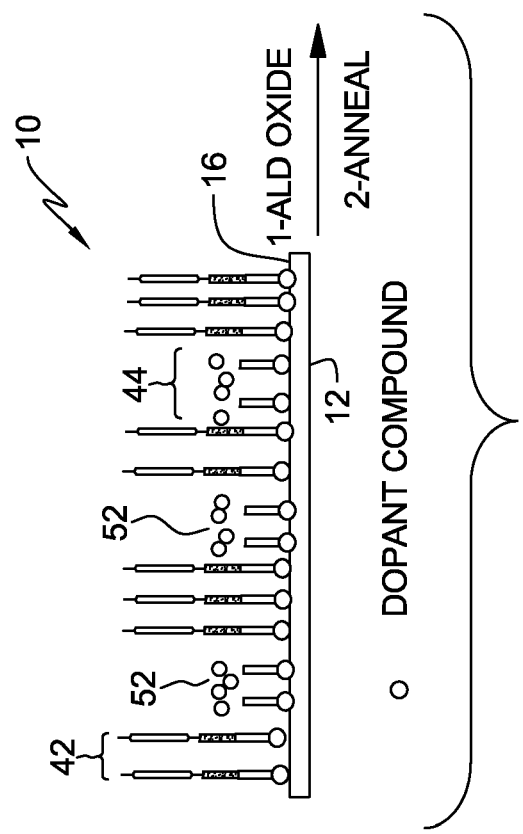
FIG. 5 shows a dopant solution deposited on the patterned monolayer of FIG. 4.

With reference to FIG. 5, after the desired pattern of regions 42 and 44 is formed on surface 16 of structure 10, an aqueous (or alcohol) solution solution of a dopant compound 52 (e.g. boric acid, organic boronic acid, phosphonic acids, etc.) is deposited on the semiconductor surface by, for example, spin coating or doctor blading. These deposited materials will only attach on the hydrophilic regions 44.

Any suitable dopant solution may be used; and for instance, the solution may comprise a blend of first and second polar organic solvents having a silicon oxide-forming compound and a boron compound dissolved therein. The first solvent may have a boiling point of 50° C. to 150° C. and constitute about 60% to 90% by weight of the total composition. The second solvent may have a boiling point between 185° C. to 300° C. and constitute about 0.5% to 30% of the composition. For example, the solvent blend may include 2-ethoxyethanol (cellosolve), boiling at 135° C., and dimethylphthalate boiling at 282° C., in a ratio of about 13:1, respectively.

In one embodiment, the composition may also include boric acid or boron oxide ($B_2O_3$) as the dopant species, and a silicon oxide-forming compound prepared by reacting tetraethylorthosilicate with acetic anhydride, which yields an equilibrium mixture of ethylacetate, triethoxysilicon acetate and diethoxysilicon diacetate.

Other solvents which may be substituted for ethoxyethanol include lower alcohols, such as ethanol; lower ketones, including acetone and methyl ethyl ketone; and alkyl ethers, such as ethyl ether and methyl ethyl ether, in addition to other alkoxyalcohols, such as methoxyethanol.

Other solvents that may be substituted for dimethylphthalate include other aromatic esters, such as lower alkyl phthalates, i.e., methyl ethyl phthalate, diethyl phthalate and dipropyl phthalate; lower alkyl isophthlates, such as diethylisophthilate; and salicylates, such as ethyl salicylate, methyl salicylate and isoamyl salicylate.

The conductivity type-determining dopant for diffusion in silicon is generally selected from boron, phosphorous, and arsenic. Gold is also a useful dopant for lifetime control. These dopants may be added to the compositions in the form of boron oxide, orthophosphoric acid, orthoarsenic acid, and gold chloride, respectively. Other dopant species are useful, with essentially equivalent results. Zinc chloride is a suitable source of zinc for diffusion in gallium arsenide.

The composition may include about 60% to 90% by weight solvent, and a ratio of silicon atoms to dopant atoms of about 1.5:1 up to about 6:1, depending primarily upon the doping level required in the semiconductor. The molar ratio of acetic anhydride to tetraethylorthosilicate added may be about 1.5:1 up to 3:1, and, as a more specific example, about 2.0:1 up to 2.3:1.

Any suitable procedure may be employed to deposit the dopant solution on the substrate surface 16, and for example, as mentioned above, spin coating or doctor blading may be used.

Figure 6:
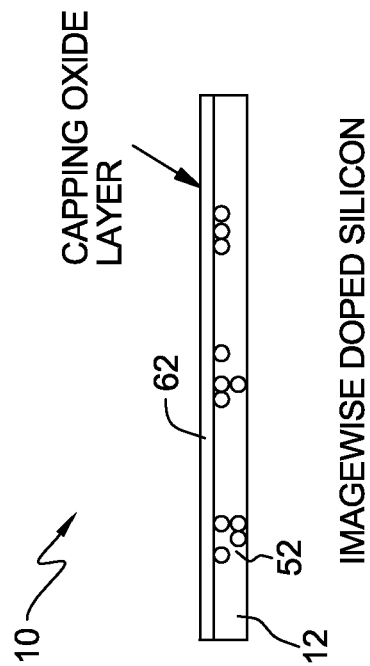
FIG. 6 illustrates a capping oxide layer formed on the doped semiconductor structure of FIG. 5.

After deposition, the substrate 12 is then coated with a very thin layer of oxide, shown in FIG. 6 at 62 (e.g. aluminum oxide or hafnium oxide) by atomic layer deposition to cap the compounds, and then the substrate is annealed at high temperatures to diffuse the dopant atoms into the silicon and to activate the dopant. Heating to diffusion temperatures of about 1100° C., for example, causes dopant to pass into the semiconductor, as will be readily appreciated by one skilled in the art. Initial heating at a low temperature is optional.

While it is apparent that the invention herein disclosed is well calculated to fulfill objects discussed above, it will be appreciated that numerous modifications and embodiments may be devised by those skilled in the art, and it is intended that the appended claims cover all such modifications and embodiments as fall within the true spirit and scope of the present invention.

The invention claimed is:

1. A method of fabricating a semiconductor device, comprising:
providing a semiconductor substrate including an oxide surface;
patterning said surface into hydrophobic and hydrophilic regions;
depositing a compound including a dopant on the substrate, wherein the dopant adheres to the hydrophilic region; and
diffusing the dopant into the oxide surface of the substrate.

2. The method according to claim 1, further comprising capping the dopant compound on the substrate.

3. The method according to claim 2, wherein the capping includes forming an oxide layer over the oxide surface of the substrate.

4. The method according to claim 3, wherein the diffusing includes annealing the substrate after said capping to diffuse the dopant into the oxide surface of the substrate.

5. The method according to claim 1, wherein the diffusing includes annealing the substrate to diffuse the dopant into the oxide surface of the substrate.

6. The method according to claim 1, wherein the dopant does not adhere to the hydrophobic region.

7. The method according to claim 1, wherein said compound is an aqueous or alcohol solution.

8. The method according to claim 1, wherein the patterning includes:
    applying a monolayer of a photosensitive material to said oxide surface; and
    exposing the monolayer to radiation to form the monolayer into a pattern of said hydrophobic an hydrophilic regions, said regions including at least one hydrophobic region and at least one hydrophilic region.

9. The method according to claim 8, wherein:
    the monolayer includes a first, hydrophilic group attached to the oxide surface;
    the exposing includes exposing a portion of said first group; and
    the depositing include adhering the dopant compound to said exposed portion of the first group of the monolayer.

10. The method according to claim 9, wherein the monolayer further includes a second, photosensitive group and a third, hydrophobic group; and the dopant compound does not adhere to said third, hydrophobic group of the monolayer.

11. A method of fabricating a semiconductor device, comprising:
    providing a substrate having an oxide surface;
    applying a monolayer of a photosensitive material to said oxide surface;
    exposing the monolayer to radiation to form the monolayer into a pattern of non-overlapping first and second regions, said first regions being hydrophobic, and said second regions being hydrophilic;
    depositing a solution including dopants on the monolayer, after said exposing, wherein the solution adheres to said second regions;
    wherein the solution does not adhere to said first regions to form patterned dopant regions on said substrate; and
    diffusing the dopants from the solution into said oxide surface.

12. The method according to claim 11, further comprising capping the dopants on said substrate.

13. The method according to claim 12, wherein said Capping layer is an oxide layer.

14. The method according to claim 11, wherein the hydrophic regions of the monolayer are substantially free of the dopant compound.

15. The method according to claim 14, wherein the diffusing includes annealing the substrate to diffuse the dopants into the oxide surface.

* * * * *